US006598314B1

(12) United States Patent
Kuo et al.

(10) Patent No.: US 6,598,314 B1
(45) Date of Patent: Jul. 29, 2003

(54) METHOD OF DRYING WAFERS

(75) Inventors: Wen-Chang Kuo, Hsin-Chu (TW); Szu-Yao Wang, Hsin chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/036,887

(22) Filed: Jan. 4, 2002

(51) Int. Cl.[7] .................................................. F26B 3/34
(52) U.S. Cl. ............................................. 34/265; 34/443
(58) Field of Search .......................... 34/443, 461, 516, 34/259, 265

(56) References Cited

U.S. PATENT DOCUMENTS

| 5,656,329 | A | | 8/1997 | Hampden-Smith et al. . | 427/226 |
|---|---|---|---|---|---|
| 6,004,399 | A | | 12/1999 | Wong et al. .................... | 134/2 |
| 6,041,799 | A | * | 3/2000 | Aoki ........................... | 134/184 |
| 6,092,301 | A | * | 7/2000 | Komanowsky ............... | 34/263 |
| 6,119,367 | A | | 9/2000 | Kamikawa et al. ........... | 34/401 |
| 6,128,829 | A | | 10/2000 | Wolke et al. ................. | 34/259 |
| 6,192,600 | B1 | * | 2/2001 | Bergman ...................... | 34/267 |
| 6,200,387 | B1 | | 3/2001 | Ni .............................. | 118/722 |
| 6,219,936 | B1 | | 4/2001 | Kedo et al. ................... | 34/381 |
| 6,323,470 | B2 | * | 11/2001 | Schmidt et al. ............. | 219/679 |
| 6,360,756 | B1 | * | 3/2002 | Chen et al. ................. | 134/95.3 |
| 6,372,657 | B1 | * | 4/2002 | Hineman et al. ........... | 438/723 |

* cited by examiner

Primary Examiner—Ira S. Lazarus
Assistant Examiner—K B. Rinehart
(74) Attorney, Agent, or Firm—George O. Saile; Stephen B. Ackerman

(57) ABSTRACT

A new method and apparatus is provided for the cleaning and drying of a wafer. An IPA vapor is created using an ultrasonic nebulizer that can be operated at a relatively low temperature. The water and the IPA that is used by the cleaning and drying process will be heated and evaporated using energy supplied by a microwave source of energy.

24 Claims, 4 Drawing Sheets

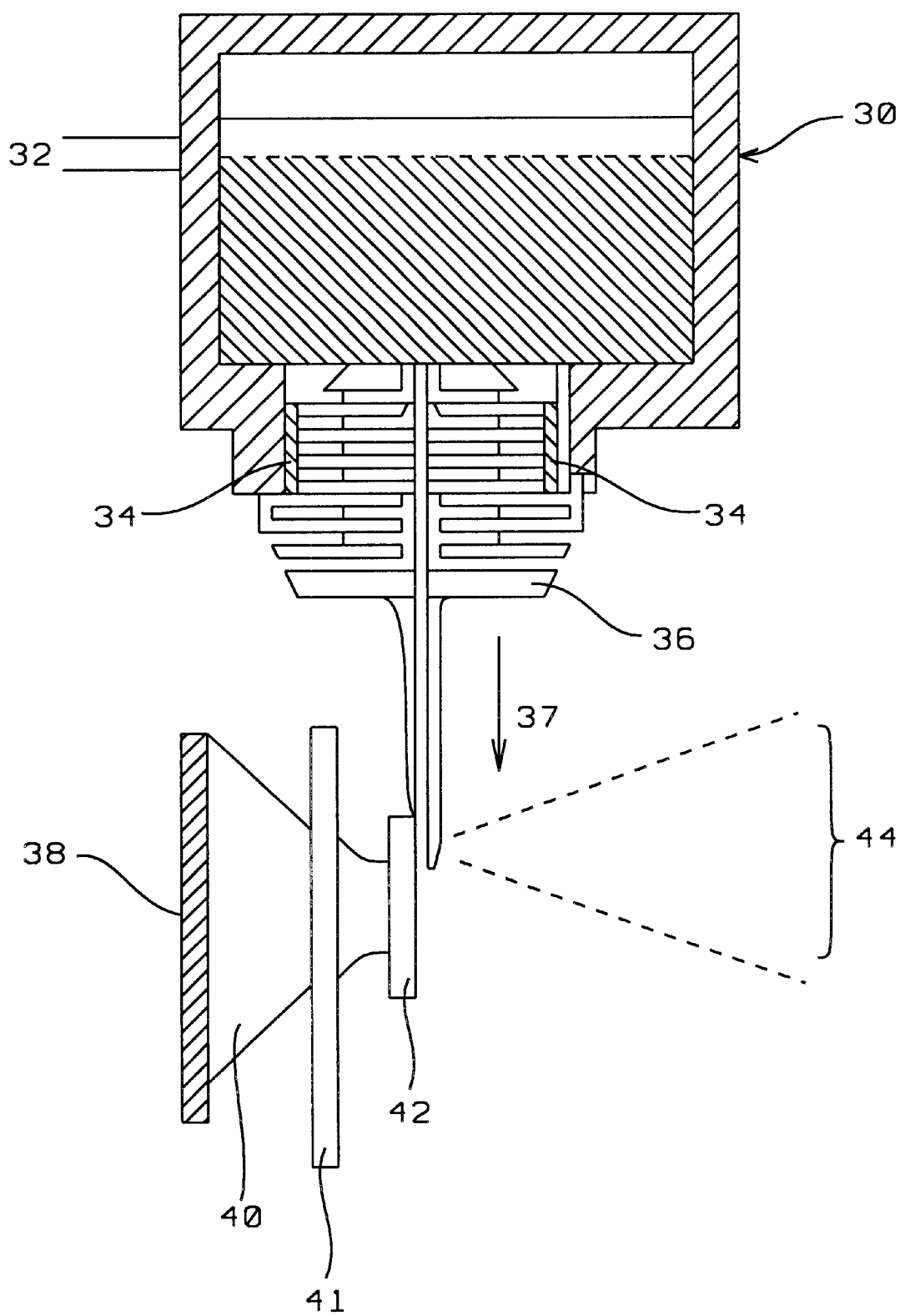
FIG. 4 – Prior Art

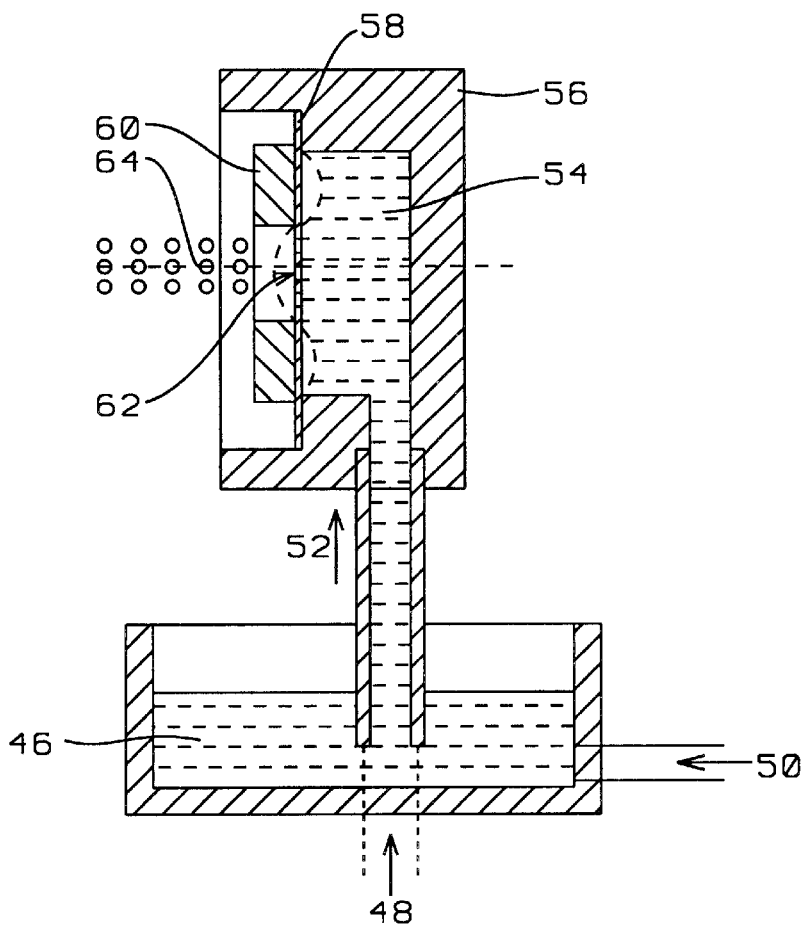
*FIG. 5 - Prior Art*
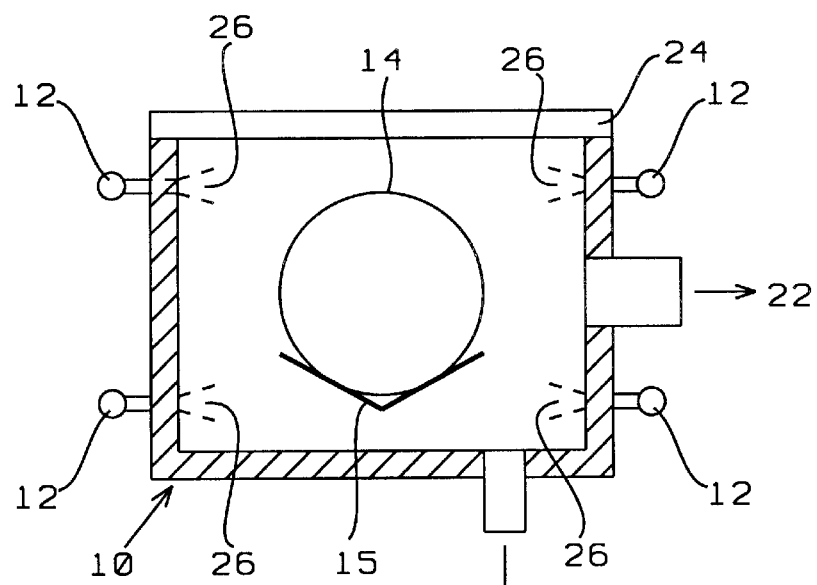
*FIG. 6*

METHOD OF DRYING WAFERS

BACKGROUND OF THE INVENTION (1) Field of the Invention

The invention relates to the fabrication of integrated circuit devices, and more particularly, to a method and apparatus for the drying of wafers.

(2) Description of the Prior Art

In the creation of semiconductor devices, these devices are typically created in or on the surface of a semiconductor wafer. After the process of creating the devices in or on the surface of the wafer and also during intervening processing steps, the need arises for drying the surface of the wafer. One of the conventional methods that is used for this purpose is the application of a cascade rinse whereby the wafer is placed into a water supply that is provided in an inner chamber while the rinsing water is transferred from an outer chamber to the inner chamber. This causes problems of water purity since there is an interconnect between the various chambers of the rinsing apparatus. Further, even after the process of cleaning the wafer has been completed, the wafer must as yet be dried, which may again be a source of introducing foreign matter (contaminants) onto the surface of the wafer.

Other methods employ the quick insertion of the wafer into a tank containing water in order to remove contaminants and other impurities in one, quick operation. Since particles that need to be removed from a surface must at times be agitated before the particle is loosened from the surface and can then be removed, this method of wafer cleaning has also proven to be not satisfactory.

Yet another method relies on spinning the wafer at high speed while water is applied to the surface of the wafer. Dislodged particles are in this manner removed from the surface of the wafer by centrifugal force, a step of drying the wafer can be applied as part of this sequence. This method requires rather complex supporting tools and equipment and, due to the violent nature of the process, the degree of particle removal is difficult to control.

Yet another method uses an isopropyl alcohol (IPA) vapor dryer or a full displacement IPA dryer. These methods typically require large amounts of IPA in order to achieve drying the wafer satisfactorily. In addition, to completely dry a wafer using this method requires a large drying time, adding to product costs. Also, the method of IPA vapor dry requires a high temperature of in excess of 200 degrees C. adding to the thermal budget of the process.

There is therefore a need in the industry to provide a method of cleaning and drying wafers that is cost-effective (low thermal requirements and limiting the need for a cleaning agent such as IPA) and that is simple to operate (low equipment cost). The invention provides such a method by reducing the temperature that is required to dry a wafer while heating and the drying of the wafer will be achieved using energy from a microwave source.

U.S. Pat. No. 6,200,387 (Ni) shows a nebulizer and megasonic system using IPA.

U.S. Pat. No. 6,219,936 (Kedo et al.) shows a drying process using IPA and an ultrasonic nebulizer, see cols. 4, 6–8.

U.S. Pat. No. 6,119,367 (Kamikawa et al.), U.S. Pat. No. 6,128,829 (Wolke et al.), U.S. Pat No. 6,004,239 (Wong et al.) and U.S. Pat. No. 5,656,329 (Hampden-Smith et al.) are related patents involving misters, IPA, sonics and drying wafers.

SUMMARY OF THE INVENTION

A principle objective of the invention is to provide a cost-effective method and apparatus for the cleaning and drying of a wafer.

Another objective of the invention is to limit the thermal budget that is required for the cleaning and drying of a wafer.

Yet another objective of the invention is to provide a method and apparatus for cleaning and drying a wafer that requires a limited amount of cleaning agent.

A still further objective of the invention is to provide a method and apparatus for cleaning and drying a wafer that can be completed in a relatively short period of time.

In accordance with the objectives of the invention a new method and apparatus is provided for the cleaning and drying of a wafer. An IPA vapor is created using an ultrasonic nebulizer that can be operated at a relatively low temperature. The water and the IPA that is used by the cleaning and drying process will be heated and evaporated using energy supplied by a microwave source of energy.

BRIEF DESCRIPTION OF THE DRAWINGS

FIG. 4 shows a cross section of a first type of nebulizer, this nebulizer is not part of the invention.

FIG. 5 shows a cross section of a second type of nebulizer, this nebulizer is not part of the invention.

FIG. 6 shows a modification of the microwave-drying chamber with the ultrasonic nebulizer of the invention.

DESCRIPTION OF THE PREFERRED EMBODIMENTS

Figure 1:
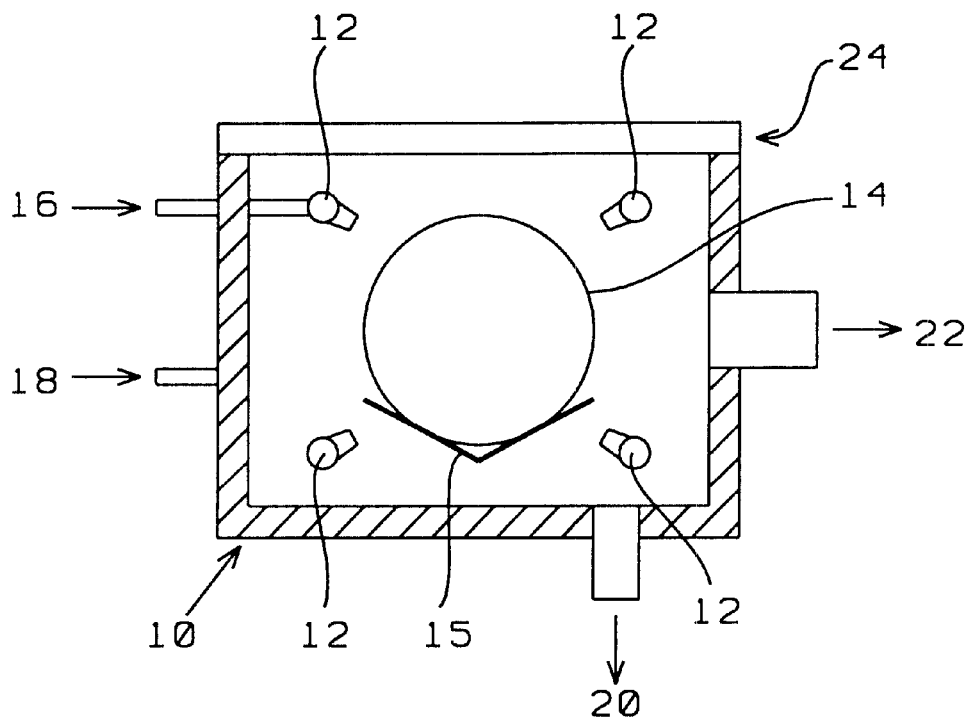
FIG. 1 shows a cross section of the microwave-drying chamber with the ultrasonic nebulizer of the invention.

Referring now to FIG. 1, there is shown a cross section of the microwave-drying chamber with the ultrasonic nebulizer of the invention. Highlighted in FIG. 1 are:

10, the microwave drying chamber of the invention 12, the ultrasonic nebulizer 14, a wafer being processed 15, a wafer positioning barrier or stop 16, a first entry port of the microwave drying chamber 10; supplied through first entry port 16 is the cleaning agent which typically comprises IPA, the IPA may be mixed with DI water up to a percentage of the total cleaning agent 18, a second entry port of the microwave drying chamber 10; supplied through second entry port 18 is an inert gas such as $N_2$ 20, the drain of the microwave drying chamber 10

22, an exhaust vent of the microwave drying chamber 10

24, the top cover of the microwave drying chamber 10.

The processing sequence of the invention can be explained using the following FIGS. 2–5.

It must be pointed out that the invention is not limited to using $N_2$ as an inert gas but can equally apply other inert gasses such as Ne, Kr, Xe, CO, $CO_2$, He, Ar, $N_2$ and mixtures thereof.

Figure 2:
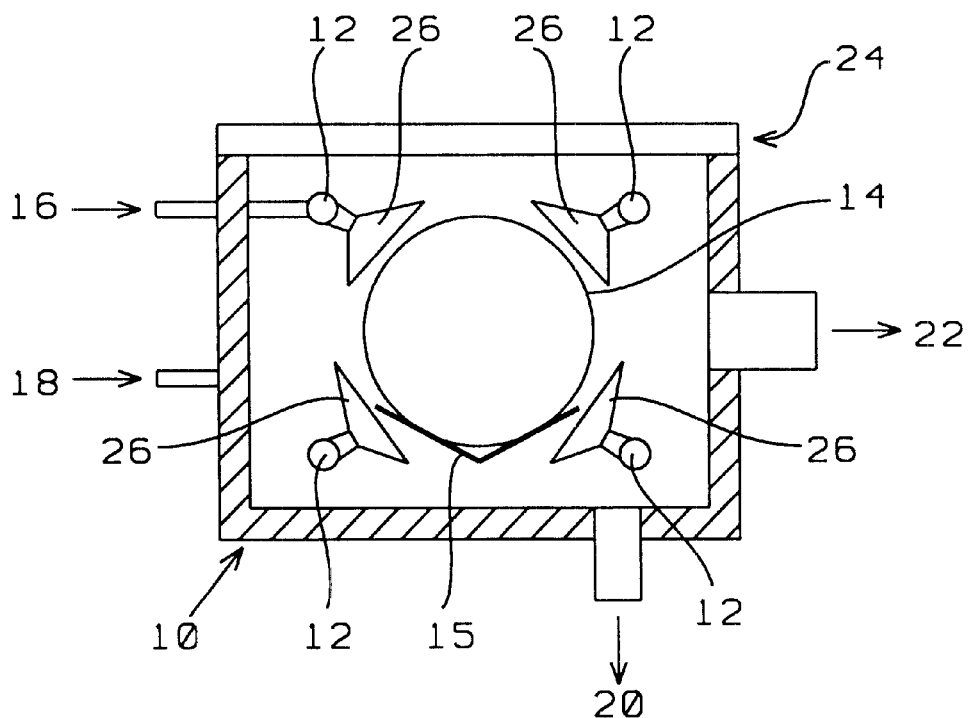
FIG. 2 represents a first processing step of the invention.

FIG. 2 represents the first processing step of the invention. Shown is the cross section of the microwave drying chamber with the ultrasonic nebulizer while IPA, possibly mixed with DI water, is dispensed in the form of vapor spray 26 into the microwave drying chamber 10 by the ultrasonic nebulizers 12. The processing sequence that is executed under this step is as follows:

1. the wafer 14 is loaded into the microwave drying chamber 10
2. the top cover 24 is placed on top of the microwave drying chamber
3. exhaust 22 and the second entry port 18 are closed
4. IPA is supplied, possibly mixed with DI water, to the ultrasonic nebulizers 12; the microwave energy that is present inside the microwave drying chamber 10 converts the supplied IPA, possibly mixed with DIW, into a spay 26 of IPA vapor, possibly mixed with DI water vapor; the combined activity of supplying IPA, possibly mixed with DI water and energizing the microwave-energy is to continue for at least 30 seconds
5. discontinue the supply of IPA, possibly mixed with DI water
6. open exhaust 22 and the second port of entry 18, allowing inert gas to enter the microwave drying chamber 10, thereby removing IPA vapors, possibly mixed with DIW vapors, from the microwave drying chamber 10.

Figure 3:
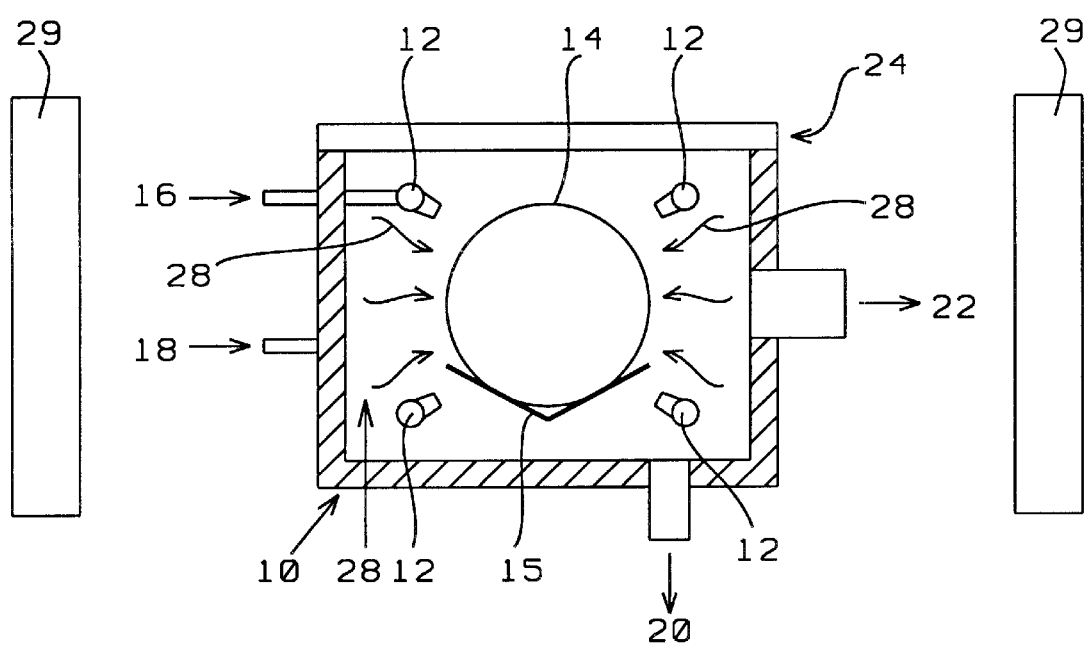
FIG. 3 represents a second processing step of the invention.

FIG. 3 represents the second processing step of the invention, shown is the cross section of the microwave-drying chamber with the ultrasonic nebulizer of the invention while microwave energy 28 is applied by the microwave energy supply unit 29. The microwave energy 28 in this case has a major energy transfer with the surface of the wafer 14, heating the wafer 14 and most importantly the surface of the wafer 14, drying the surface of wafer 14 as a consequence.

FIGS. 4 and 5 show details of two types of ultrasonic nebulizers 12 that can be used by the invention. These nebulizers are well known in the art and are not part of the invention.

Specifically highlighted in the cross section of a first type of nebulizer as shown in FIG. 4 are:

30, a reservoir or tank that contains the IPA, possibly mixed with DIW that is used for the cleaning/drying process of the invention 32, the entry port to reservoir 30; IPA, possibly mixed with DIW is entered into reservoir 30 through this entry port 34, a concentric plastic ring into which is used to house unit 36, a nozzle through which IPA, possibly mixed with DIW, exits the reservoir 30 in direction 37

38, a piezoelectric vibrator that has as function to increase evaporation (breaking up in smaller droplets) of the IPA, possibly mixed with DIW that exits reservoir 30

40 the vibration horn of the piezoelectric vibrator 38

41, a supporting surface for the piezoelectric vibrator 38

42, the surface area of the piezoelectric vibrator 39 where the mist of IPA, possibly mixed with DIW, is essentially formed 44, the mist of IPA, possibly mixed with DIW that exists the ultrasonic nebulizer 12.

Specifically highlighted in the cross section of a second type of nebulizer as shown in FIG. 5 are:

46, a supply reservoir that can be supplied with IPA, possibly mixed with DIW via either 48, a first entry port into vessel 46, or 50, a second alternate entry port into vessel 46

52, the direction in which IPA, possibly mixed with DIW, is fed to the distribution nozzle 54, the IPA, possibly mixed with DIW, before evaporation and distribution 56, a housing for components of the nebulizer 58, a screen or vibration plate through which the IPA, possibly mixed with DIW, passes 60, a piezoelectric vibrator 62, small openings through the piezoelectric vibrator through which the IPA, possibly mixed with DIW, passes 64, a mist of vaporized IPA, possibly mixed with DIW, after the IPA, possibly mixed with DIW, is ejected from the nebulizer.

A modification of the microwave-drying chamber with the ultrasonic nebulizer of the invention is shown in cross section in FIG. 6. This cross section shows a modified mounting position of the nebulizers 12 whereby the nebulizers have been mounted external to the microwave drying chamber 10 of the invention. The mist of IPA, possibly mixed with DIW, in this case emanates essentially from the sidewalls of the microwave-drying chamber 10.

It must further be pointed out that, although the drawings have shown the presence of one wafer inside the microwave drying chamber 10, the invention is not limited to processing only one wafer at a time but can readily be altered, by altering the dimensions of the microwave drying chamber 10, to accept more than one wafer for simultaneous processing of a multiplicity of wafers during one processing sequence. Dimensional modification of the microwave drying chamber 10 is, for this kind of application, essentially limited to extending the height of the microwave drying chamber so that a cassette of wafers can be entered at one time into the microwave drying chamber 10 for cleaning and drying.

The essential steps of the invention can be summarized as follows:

1. the IPA vapor, possibly mixed with DIW, is generated by an ultrasonic nebulizer inside a microwave drying chamber
2. the IPA vapor, possibly mixed with DIW, will be deposited on the surface of the wafer
3. the IPA vapor, possibly mixed with DIW, will be heated and evaporated from the surface of the wafer by applying microwave energy to the wafer and to the IPA vapor, possibly mixed with DIW, that has been deposited on the surface of the wafer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A wafer drying apparatus, comprising:

a first entry port;

a second entry port;

entry of IPA possibly mixed with DIW into the wafer drying apparatus through said first entry port, forming a mist spraying device;

entry of an inert gas into the wafer drying apparatus through said second entry port;

a top cover for positioning of wafers into said wafer drying apparatus;

a drain vent;

an exhaust vent;

a wafer arrestor positioned inside said wafer drying apparatus for proper positioning of at least one wafer inside the wafer drying apparatus;

at least one ultrasonic nebulizer positioned inside said wafer drying apparatus;

supply of isopropyl alcohol (IPA), possibly mixed with DI water, to said at least one ultrasonic nebulizers via said first entry port to said wafer drying apparatus; and creation of ultrasonic energy inside said wafer-drying apparatus by using a microwave energy supply unit.

2. The apparatus of claim 1, said at least one ultrasonic nebulizer being positioned in sidewalls of said wafer drying apparatus.

3. The apparatus of claim 1, wherein a wafer positioned inside said wafer drying apparatus has an ambient temperature, said IPA possibly mixed with DIW being entered into said wafer drying apparatus having a temperature of at least 15 degrees C.

4. The apparatus of claim 1, wherein the IPA in mist form is in such a state that only the IPA is suspended in the inert gas.

5. The apparatus of claim 1, wherein said mist-spraying device is adapted to spray IPA in mist-form at a temperature between about 5 and 60 degrees higher than a temperature of the at least one wafer.

6. A wafer drying method, comprising the steps of:

providing a microwave-drying chamber, said microwave drying chamber comprising:
(i) a first and a second entry port, liquid cleaning fluid being entered into the microwave drying chamber through said first entry port, an inert gas being entered into the microwave drying chamber though said second entry port;
(ii) a top cover;
(iii) a drain and an exhaust vent;
(iv) a wafer arrestor positioned inside said microwave drying chamber for proper positioning of wafers inside said microwave drying chamber;
(v) at least one ultrasonic nebulizer, positioned inside said microwave drying chamber;
(vi) the ability to supply cleaning fluid to said at least one ultrasonic nebulizers via said first entry port to said microwave drying chamber; and
(vii) the ability of creating first and second microwave energy inside said microwave-drying chamber by using a microwave energy supply unit;

positioning at least one wafer inside said microwave drying chamber;

performing a first processing step, said first processing step creating a cleaning vapor, inside a microwave drying chamber, said cleaning vapor being generated by an ultrasonic nebulizer;

performing a second processing step by applying microwave energy to the wafer and to the cleaning vapor, heating the cleaning vapor, removing the cleaning vapor from the surface of said at least one wafer.

7. The method of claim 6, said cleaning vapor-comprising IPA possibly mixed with DIW.

8. The method of claim 6, wherein positioning at least one wafer inside said microwave drying chamber comprises the steps of:

removing the top cover from said microwave drying chamber;

positioning said at least one wafer inside said microwave drying chamber, using said wafer arrestor for proper positioning of said at least one wafer; and placing said top cover on the microwave-drying chamber.

9. The method of claim 6, wherein said performing a first processing step comprises the steps of:

closing said first and second entry ports;

first activating the microwave energy supply unit of the microwave-drying chamber, generating microwave energy inside the microwave drying chamber;

opening said first entry port to the microwave drying chamber, thereby applying liquid cleaning fluid to said at least one ultrasonic nebulizer;

allowing conversion of the supplied liquid cleaning fluid into a spray of cleaning vapor, by the microwave energy that is present inside the microwave chamber by energizing the microwave energy supply unit;

discontinuing the supply of liquid cleaning fluid, by closing the first entry port to the microwave drying chamber; and turning off the microwave unit of the microwave-drying chamber.

10. The method of claim 6, wherein said performing a second processing step comprises the steps of:

opening the exhaust vent and the second port of entry of the microwave drying chamber, allowing inert gas to enter into the microwave drying chamber, thereby removing cleaning vapors from the microwave drying chamber; and second activating a microwave energy supply unit of the microwave drying chamber, generating microwave energy inside the microwave drying chamber, initiating energy transfer to said at least one wafer, drying said at least one wafer as a consequence.

11. The method of claim 7, said inert gas comprising $N_2$.

12. The method of claim 7, said inert gas being selected from the group consisting of Ne and Kr and Xe and CO and $CO_2$ and He and Ar and $N_2$ and mixtures thereof.

13. The method of claim 7, said at least one ultrasonic nebulizer having been positioned in sidewalls-of said microwave drying chamber.

14. A wafer drying method, comprising the steps of:

providing a microwave-drying chamber, said microwave drying chamber comprising:
(i) a first and a second entry port, IPA possibly mixed with DIA being entered into the microwave drying chamber through said first entry port, an inert gas being entered into the microwave drying chamber though said second entry port;
(ii) a top cover;
(iii) a drain and an exhaust vent;
(iv) a wafer arrestor positioned inside said microwave drying chamber for proper positioning of wafers inside said microwave drying chamber;
(v) at least one ultrasonic nebulizer, positioned inside said microwave drying chamber;
(vi) the ability to supply isopropyl alcohol (IPA), possibly mixed with DI water, to said at least one ultrasonic nebulizers via said first entry port to said microwave drying chamber; and
(vii) the ability of creating first and second ultrasonic energy inside said microwave-drying chamber by using a microwave energy supply unit;

positioning at least one wafer inside said microwave drying chamber;

performing a first processing step, said first processing step creating an IPA vapor, possibly mixed with DIW, inside a microwave drying chamber, said IPA vapor, possibly mixed with DIW being generated by an ultrasonic nebulizer;

performing a second processing step by applying microwave energy to the wafer and to the IPA vapor, possibly mixed with DIW, heating the IPA vapor, possibly mixed with DIW, removing the IPA vapor, possibly mixed with DIW, from the surface of said at least one wafer.

15. The method of claim 14, wherein positioning at least one wafer inside said microwave drying chamber comprises the steps of:

removing the top cover from said microwave drying chamber;

positioning said at least one wafer inside said microwave drying chamber, using said wafer arrestor for proper positioning of said at least one wafer; and placing said top cover on the microwave-drying chamber.

16. The method of claim 14, wherein said performing a first processing step comprises the steps of:

closing first and second entry ports of said microwave-drying chamber;

first activating the microwave energy supply unit of the microwave-drying chamber, generating microwave energy inside the microwave drying chamber;

opening said first entry port to the microwave drying-chamber, thereby applying isopropyl alcohol (IPA), possibly mixed with DI water, to said at least one ultrasonic nebulizer;, allowing conversion of the supplied IPA, possibly mixed with DIW, into a spray of IPA vapor, possibly mixed with DI water vapor, by the microwave energy that is present inside the microwave chamber for energizing the microwave energy supply unit for a period of time of between about 30 seconds and 5 minutes;

discontinuing the supply of IPA, possibly mixed with DI water by closing the first entry port to the microwave drying chamber; and turning off the microwave unit of the microwave-drying chamber.

17. The method of claim 14, wherein said performing a second processing step comprises the steps of:

opening the exhaust vent and the second port of entry of the microwave drying chamber, allowing inert gas to enter into the microwave drying chamber, thereby removing IPA vapors, possibly mixed with DIW vapors, from the microwave drying chamber; and second activating the microwave energy supply unit of the microwave drying chamber, generating microwave energy inside the microwave drying chamber, initiating energy transfer to the surface of said at least one wafer, drying the surface of said at least one wafer as a consequence.

18. The method of claim 14, said inert gas comprising $N_2$.

19. The method of claims 14, said inert gas being selected from the group consisting of Ne and Kr and Xe and CO and $CO_2$ and He and Ar and $N_2$ and mixtures thereof.

20. The method of claim 14, said at least one ultrasonic nebulizer having been positioned in sidewalls of said microwave drying chamber.

21. A wafer drying method, comprising the steps of:

providing a microwave drying chamber, said microwave drying chamber having been provided with a first and a second entry port, isopropyl alcohol (IPA) possibly mixed with DI water (DIW) being entered into the microwave drying chamber through said first entry port, an inert gas being entered into the microwave drying chamber though said second entry port, said microwave drying chamber further having been provided with a top cover, said microwave drying chamber further having been provided with a drain and an exhaust vent, a wafer arrestor having been positioned inside said microwave drying chamber for proper positioning of wafers inside said microwave drying chamber, at least one ultrasonic nebulizer having been positioned inside said microwave drying chamber, isopropyl alcohol (IPA), possibly mixed with DI water, being supplied to said at least one ultrasonic nebulizers via said first entry port to said microwave drying chamber, said microwave drying chamber being able of creating ultrasonic energy inside said microwave drying chamber by using a microwave energy supply unit;

providing at least one wafer;

removing the top cover from said microwave drying chamber;

positioning said at least one wafer inside said microwave drying chamber, using said wafer arrestor for proper positioning of said at least one wafer;

placing said top cover on the microwave-drying chamber;

opening said first entry port to the microwave drying chamber, thereby applying isopropyl alcohol (IPA), possibly mixed with DI water, to said at least one ultrasonic nebulizer;

allowing conversion of the supplied IPA, possibly mixed with DIW, into a spray of IPA vapor, possibly mixed with DI water vapor, by the microwave drying chamber for energizing a microwave energy that is present inside the microwave drying chamber by energizing the microwave energy supply unit for a period of time of at least 30 seconds;

discontinuing the supply of IPA, possibly mixed with DI water, by closing the first entry port to the microwave-drying chamber;

activating the microwave energy supply unit of the microwave-drying chamber, generating microwave energy inside the microwave drying chamber;

opening the exhaust vent and the second port of entry of the microwave drying chamber, allowing inert gas to enter into the microwave drying chamber, thereby removing IPA vapors, possibly mixed with DIW vapors, from the microwave drying chamber;

drying the IPA, possibly mixed with DIW, on the surface of said wafer; and turning off the microwave unit of the microwave-drying chamber.

22. The method of claim 21, wherein said inert gas comprises $N_2$.

23. The method of claim 21, wherein said inert gas is selected from the group consisting of Ne and Kr and Xe and CO and $CO_2$ and He and Ar and $N_2$ and mixtures thereof.

24. The method of claim 21, said at least one ultrasonic nebulizer having been positioned in sidewalls of said microwave drying chamber.

* * * * *